US012009320B2

United States Patent
Qian et al.

(10) Patent No.: US 12,009,320 B2
(45) Date of Patent: Jun. 11, 2024

(54) INTERCONNECT LOSS OF HIGH DENSITY PACKAGE WITH MAGNETIC MATERIAL

(71) Applicant: Intel Corporation, Santa Clara, CA (US)

(72) Inventors: Zhiguo Qian, Chandler, AZ (US); Cemil Geyik, Gilbert, AZ (US); Jiwei Sun, Chandler, AZ (US); Gang Duan, Chandler, AZ (US); Kemal Aygün, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 1099 days.

(21) Appl. No.: 16/596,383

(22) Filed: Oct. 8, 2019

(65) Prior Publication Data

US 2021/0104476 A1  Apr. 8, 2021

(51) Int. Cl.
  *H01L 23/49* (2006.01)
  *H01L 23/498* (2006.01)
  *H01L 23/64* (2006.01)

(52) U.S. Cl.
  CPC ...... *H01L 23/645* (2013.01); *H01L 23/49822* (2013.01); *H01L 23/49838* (2013.01); *H01L 23/49866* (2013.01)

(58) Field of Classification Search
  CPC ......... H01L 24/02; H01L 24/05; H01L 24/06; H01L 21/561; H01L 21/568; H01L 24/19; H01L 24/20; H01L 24/92; H01L 23/48; H01L 21/563; H01L 24/97; H01L 21/76838; H01L 23/3157; H01L 24/08; H01L 24/80; H01L 24/96; H01L 21/56; H01L 21/78; H01L 2924/181; H01L 2224/13124; H01L 2224/13144; H01L 2224/13113; H01L 2224/05669; H01L 2224/04105; H01L 2224/05644; H01L 2224/1132; H01L 2224/05008; H01L 2224/05611; H01L 2224/0558; H01L 2224/11462; H01L 2224/13024;
(Continued)

(56) References Cited

U.S. PATENT DOCUMENTS

| 9,697,946 | B2 * | 7/2017 | Otsubo | H01F 27/2804 |
| 2001/0014001 | A1 * | 8/2001 | Aoshima | B82Y 25/00 |
| 2011/0095856 | A1 * | 4/2011 | Nakajima | H01F 1/344 |
| | | | | 29/602.1 |

* cited by examiner

*Primary Examiner* — Moin M Rahman
(74) *Attorney, Agent, or Firm* — Schwabe, Williamson & Wyatt P.C.

(57) ABSTRACT

Embodiments include package substrates and a semiconductor package with such package substrates. A package substrate includes a first conductive layer in a first magnetic layer, and a second magnetic layer over the first magnetic layer, where the first and second magnetic layers include magnetic materials. The package substrate also includes a second conductive layer in the second magnetic layer. The second conductive layer includes a plurality of first traces fully surrounded by the first and second magnetic layers. The package substrate includes a third conductive layer over the second magnetic layer. The magnetic materials may include manganese Mn ferrite materials, Zn/Mn ferrite materials, or Ni/Zn ferrite materials. The magnetic materials include material properties with a low constant value, a magnetic tangent value, a frequency, a base filler chemistry, a filler shape, a filler orientation, a filler percentage, a loading fraction value, a permeability, an insertion loss, and a resin formulation.

12 Claims, 5 Drawing Sheets

(58) Field of Classification Search
CPC ... H01L 2224/11849; H01L 2224/0345; H01L 2224/02311; H01L 2224/05666; H01L 2224/13116; H01L 2924/12042; H01L 2224/05671; H01L 2924/13091; H01L 2924/12041; H01L 2224/05655; H01L 2224/13155; H01L 2224/02313; H01L 2224/13147; H01L 2224/13139; H01L 2224/05664; H01L 2224/05147; H01L 2224/11464; H01L 2224/05647; H01L 2224/05624; H01L 2224/0401; H01L 2224/11334; H01L 24/03; H01L 2224/03464; H01L 2224/03462; H01L 2224/05573; H01L 2224/1145; H01L 2224/03452; H01L 2224/05166; H01L 2224/05639; H01L 2224/11901; H01L 2924/18162; H01L 2224/05572; H01L 2224/05569; H01L 2224/05548; H01L 2924/18161; H01L 2224/05687; H01L 2224/11452; H01L 2224/13111; H01L 2224/0239; H01L 2224/05024; H01L 23/525; H01L 2924/3511; H01L 2224/13022; H01L 2224/215; H01L 2224/2101; H01L 2224/214; H01L 23/3114; H01L 23/3128; H01L 23/562; H01L 24/11; H01L 24/13; H01L 24/94; H01L 2224/12105; H01L 2224/131; H01L 2224/92; H01L 2224/94; H01L 2224/97; H01L 2224/02331; H01L 2224/02371; H01L 2224/02372; H01L 2224/02377; H01L 2224/06187; H01L 2224/0801; H01L 2224/95001; H01L 2224/96; H01L 23/645; H01L 23/49822; H01L 23/49838; H01L 23/49866; H01L 23/66; H01L 24/16; H01L 2223/6638; H01L 2223/6677; H01L 2224/16227; H01L 23/49805; H01L 23/49811–49816; H01L 2224/16155–16168; H01L 2224/16225–1624; H01L 2224/24155; H01L 2224/24225–24227; H01L 2224/32155–32168; H01L 2224/32225–3224; H01L 2224/40155–40165; H01L 2224/40225–4024; H01L 2224/48155–48165; H01L 2224/48225–4824

See application file for complete search history.

INTERCONNECT LOSS OF HIGH DENSITY PACKAGE WITH MAGNETIC MATERIAL

FIELD

Embodiments relate to packaging semiconductor devices. More particularly, the embodiments relate to semiconductor devices with high-density package substrates that include magnetic materials for improved interconnect loss.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale these ICs, including package substrates, while optimizing the performance of each device, however, is not without issue.

The existing packaging industry is investing heavily in the high-density packaging technologies with capabilities for fine-pitch interconnects. These technologies enable low z-height and high-bandwidth density, however the fine-pitch interconnects and thin layers of such technologies lead to double or more times higher per-unit-length insertion loss than the standard organic substrate traces. As a result, these technologies typically cause package loss to be over budget, thereby losing product competitiveness and forcing higher-cost platform solution.

Such existing packaging technologies have attempted several approaches to overcome some of these problems. One approach is to increase the thickness (or thicknesses) of the dielectric layers. This approach leads to traces being formed over thicker dielectric layers with lower insertion loss. Another approach is to use low-loss tangent (Df) dielectric and dielectric constant (Dk) materials. For example, lower Df values reduce the loss caused by such dielectric. Moreover, this other approach leads to lower Dk values as the traces are typically wider (i.e., wider traces) to meet the same impedance target, which thereby reduces the overall conductor loss. Also, thicker layers have less competitive design rules. That is, the size of via and pads needs to be substantially larger, which thereby severely limits the density of the package substrate. The crosstalk between these traces is also significantly higher, and lower Dk and Df dielectric materials have diminishing impact on finer pitch interconnects.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
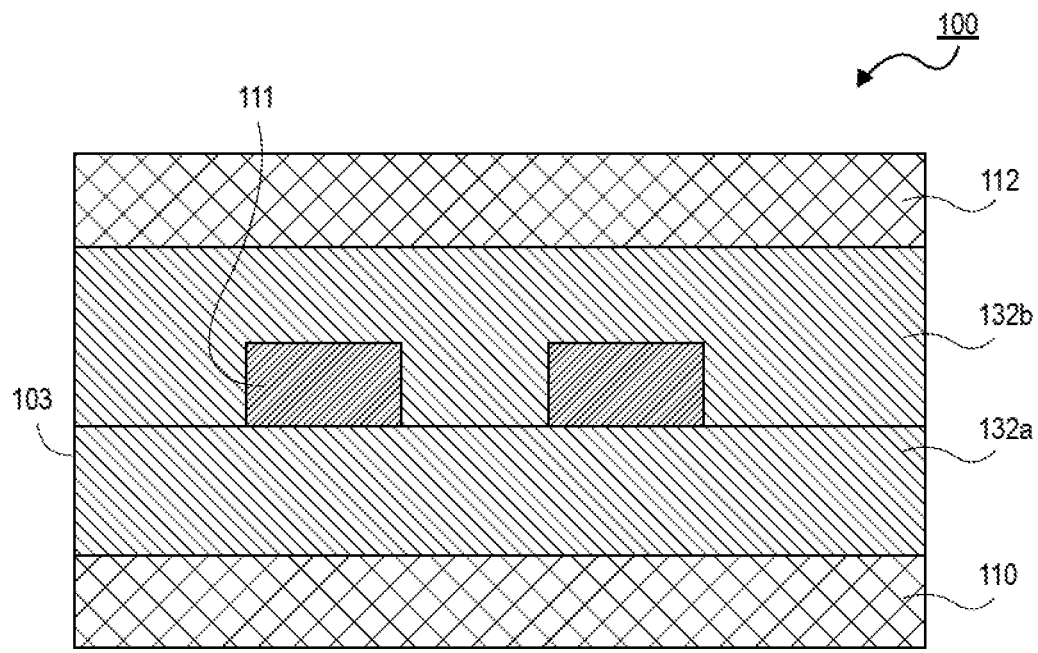
FIG. 1 is an illustration of a cross-sectional view of a package substrate that includes a plurality of conductive layers, a plurality of differential traces, and a plurality of magnetic layers, according to one embodiment.

Described herein are semiconductor packages with package substrates that have magnetic layers (or magnetic regions) over/around traces and methods of forming such semiconductor packages. The semiconductor packages described below and methods of forming such semiconductor packages include a die, a package substrate, a plurality of single-ended input/output (I/O) traces, a plurality of differential I/O traces, and a magnetic layer/region, according to some embodiments. In particular, the package substrate described herein may include a plurality of conductive layers, a plurality of signal traces, and a plurality of magnetic layers/regions, according to one embodiment.

These embodiments of the package substrate described below may include the magnetic layers/regions disposed over/below/around (or near/proximate to) the signal traces (e.g., the differential traces, the single-ended traces, etc.). That is, the embodiments described below enable the magnetic material(s) to be implemented (or disposed) (i) into each of the build-up layers of the package substrate, (ii) into only a selected layer(s), (iii) into a single layer (or a sub-layer), and/or (iv) into only a small region (or portion) that surrounds or is near/adjacent to the traces.

The package substrate described herein may have a single routing layer with single-ended routing traces and differential routing traces, where the differential routing traces and/or the single-ended routing traces may be surrounded with the magnetic layer (or magnetic region). For example, the package substrate described below may implement (i) the magnetic layer to fully surround the differential routing traces only (e.g., as shown with the magnetic layer 232 of FIGS. 2A-2B), (ii) the magnetic layer to partially surround the differential routing traces only (e.g., as shown with the magnetic layer 332 of FIGS. 3A-3B), (iii) the magnetic portion to partially surround the differential routing traces only (e.g., as shown with the magnetic portions 432a-b of FIG. 4A disposed between and above/below the traces 411), (iv) the magnetic layer (or the magnetic sub-layer) to be near/around/adjacent to the differential routing traces only (e.g., as shown with the magnetic layer 432 of FIG. 4B disposed below the traces 411), and/or (v) the magnetic layer may fully surround both the single-ended and differential traces (i.e., as the magnetic layer may encompass all of build-up layers of the package substrate).

Furthermore, the embodiments of the semiconductor packages described herein improve packaging solutions by substantially improving the performance of signal routing within the package substrates with the optimized magnetic materials of the magnetic layers/regions (e.g., manganese (Mn) ferrite, zinc/Mn (Zn/Mn) ferrite, nickel (Ni/Zn) ferrite, and/or the like). As such, the embodiments described herein improve packaging solutions by enabling the signal traces to be widened with the same target impedance, and thus substantially reducing the trace loss (or the conductor loss) with the wider signal traces that respectively have greater perimeters for current flow. These embodiments of the semiconductor packages described herein also improve packaging solutions by enabling customers (or companies, clients, etc.) to use lower-cost platform solutions instead of expensive low-loss boards, extra repeaters, or the like with the implemented magnetic materials of the package substrates.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having package substrates, dies, conductive layers, signal/transmission traces, and magnetic layers/regions.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. In one embodiment, the semiconductor package 100 may include a package substrate 103. In an embodiment, the package substrate 103 may be a high-density package substrate or the like. For one embodiment, the package substrate 103 may include a plurality of conductive layers 110-112 and a plurality of magnetic layers 132a-b. The plurality of conductive layers 110-112 may include a first conductive layer 110, a second conductive layer 111 (traces), and a third conductive layer 112. Likewise, the plurality of magnetic layers 132a-b may include a first magnetic layer 132a and a second magnetic layer 132b.

In some embodiments, the first and second magnetic layers 132a-b may fully surround (or enclose/embed) the second conductive layer 111, while the first and third conductive layers 110 and 112 are respectively disposed below and above the first and second magnetic layers 132a-b and the second conductive layer 111. In one embodiment, the second conductive layer 111 may include a plurality of traces such as signal traces, transmission traces, and/or the like. In particular, the signal/transmission traces of the second conductive layer 111 may include single-ended traces, differential traces, and/or the like.

In one embodiment, the second conductive layer 111 (or copper traces) may be disposed directly on/over the first magnetic layer 132a. In an embodiment, the second conductive layer 111 may be a plurality of differential routing traces. For example, the second conductive layer 111 may be used to form a differential I/O interface. In one embodiment, the second conductive layer 111 may be implemented with a conductive/metallic (or copper) plating process such as a semi-additive plating (SAP) process or the like. As such, as shown in FIG. 1, the second conductive layer 111 may be disposed over the first magnetic layer 132a and the first conductive layer 110, while the second magnetic layer 132b is disposed over and around the second conductive layer 111, and the third conductive layers 112 is disposed over the second magnetic layer 132b and the second conductive layer 111.

For example, in one embodiment, the second conductive layer 111 may have a thickness of approximately 4 um or less. In another embodiment, the second conductive layer 111 may have a thickness of approximately 4 um or greater. Additionally, in one embodiment, the second conductive layer 111 may have a width of approximately 7 um or less. In another embodiment, the second conductive layer 111 may have a width of approximately 7 um or greater. While, in some embodiments, the second conductive layer 111 may have a spacing of approximately 10 um or less (i.e., a spacing/width between the first trace and the second trace). In another embodiment, the second conductive layer 111 may have a spacing of approximately 10 um or less.

For some embodiments, the package substrate 103 may implement the first conductive layer 110 and the third conductive layer 112 to sandwich (or surround/embed) the magnetic layers 132a-b and the second conductive layer 111. In these embodiments, the first, second, and third conductive layers 110-112 may be disposed and positioned respectively within any of the stacked build-up layers of the package substrate 103. In one embodiment, the package substrate 103 may implement the first conductive layer 110 as the bottommost (or base) conductive layer, and the third conductive layer 112 as the topmost conductive layer. As such, in some embodiments, the package substrate 103 may implement the magnetic layers 132a-b as the entire (or complete) stack of build-up layers that extend from the bottommost conductive layer 110 to the topmost conductive layer 112. In these embodiments, the package substrate 103 may have all (or each) of the build-up layers comprised of the magnetic layers 132a-b (and/or the magnetic materials of the magnetic layers 132a-b). That is, the package substrate 103 may be comprised solely of the magnetic layers 132a-b and the conductive layers 110-112 (including any other conductive layers such as pads, lines, planes, vias, etc.). Note that the magnetic layers 132a-b may be shown as two separate layers for illustrative purposes/simplicity, but the two magnetic layers 132a-b may be one full/entire build-up layer or two or more build-up layers if desired.

As described above, the magnetic layers 132a-b may be implemented to increase the inductance of the second conductive layer 111, thereby the impedance of the second conductive layer 111 respectively increase. Accordingly, in these embodiments, the second conductive layer 111 may have a width that may be increased (or widened) to achieve the same desired impedance, which also increases the perimeter of the second conductive layer 111 to therefore achieve an increased cross-sectional area of the current flow and a reduced conductor loss. That is, the conductor loss induced attenuation $\alpha_C$ is proportional to the resistance R over the characteristic impedance $Z_C$, which equals the square root of the L and C ratio, where C and L are capacitance and inductance, respectively. If the permeability is higher, the inductance L increases. Then the trace width needs to be wider to maintain the same impedance. As such, the widen trace has more cross-sectional area for current to flow, so the resistance R is reduced to achieve lower conductor loss $\alpha_C$.

In an embodiment, the magnetic materials of the magnetic layers 132a-b may include ferrite (or ferroelectric) materials, conductive materials (or powders), epoxy materials, combinations thereof, and/or any similar magnetic materials. In some embodiments, the magnetic layers 132a-b may be optimized with magnetic materials such as Mn ferrite, Zn/Mn ferrite, Ni/Zn ferrite, and/or the like. In some embodiments, the ferrite materials of the magnetic layers 132a-b may include, but are not limited to, hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, yttrium-doped (Y-doped) hafnium oxide, and/or the like.

Additionally, in some embodiments, the magnetic layers 132a-b may be implemented with one or more parameters to improve the insertion loss of the second conductive layer 111. For example, the specified parameters of the magnetic layers 132a-b may include a base filler chemistry, a filler shape, a filler percentage, a permeability, a loss, a frequency, and so on. For example, the magnetic layers 132a-b may include a base filler chemistry of a Mn ferrite, a Zn/Mn ferrite, Ni/Zn ferrite, and/or the like. In an embodiment, when the base filler chemistry of the magnetic layers 132a-b is a Mn ferrite, the filler shape may be a spherical type (e.g., with a size of approximately 2 um or smaller), the filler percentage may be between approximately 5 to 95%. For another embodiment, when the base filler chemistry of the magnetic layers 132a-b is a Zn/Mn ferrite, the filler shape may be a crushed type (e.g., with a size of approximately 10 um or less), the filler percentage may be between approximately 5 to 95%.

Moreover, in some embodiments, the magnetic layers 132a-b may implement low constant $\mu_r$ values (e.g., $\mu_r$ values of approximately 2 or less) and a substantially low (or nearly) zero magnetic tan $\delta$ at high frequencies (e.g., tan $\delta$ values of approximately 10 GHz or greater). Additionally, the magnetic layers 132a-b may be tailored by implementing one or more tuning options to achieve $\mu_r$ of approximately equal to 2 and magnetic tan $\delta$ of approximately 0.03 or less at high frequencies, where such tuning options may include: (i) modifying the filler composition, shape, orientation, and loading fractions to achieve the desired magnetic properties, for example by focusing on the Mn ferrite filler-based materials as compared to Mn/Zn ferrite filler-based materials, and by also optimizing the resin formulations to improve the packing fractions; (ii) optimizing the filler treatment methods and manufacturing processes such as the surface coating/heat treatment improvements; and, (iii) when optimizing the magnetic properties, by optimizing the process compatibility with the organic substrate manufacturing process flow, especially the chemical resistance with wet chemistries. Note that, in some embodiments, the magnetic tan $\delta$ value is not negligible, and the insertion loss increases with the magnetic tan $\delta$. Hence, in these embodiments, it is also important to note/control the magnetic tan $\delta$ to be approximately less than 0.03 and up to 10 GHz in frequency to ensure the desired insertion loss of the second conductive layer 111.

Note that the semiconductor package 100 may include fewer or additional packaging components based on the desired packaging design.

Figure 2A:
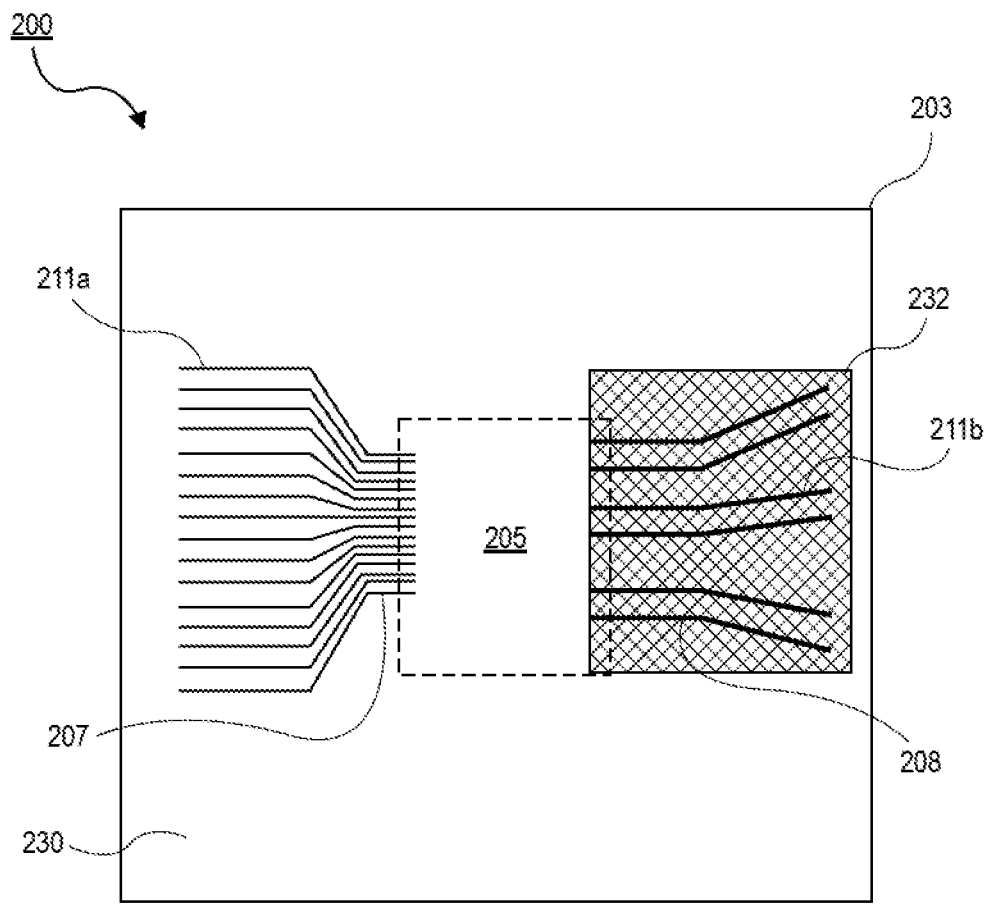
FIGS. 2A-2B are illustrations of a plan view and a respective cross-sectional view of a semiconductor package with a die and a package substrate, where the package substrate includes a plurality of single-ended input/output (I/O) traces, a plurality of differential I/O traces, and a magnetic region, according to some embodiments.
Figure 2B:
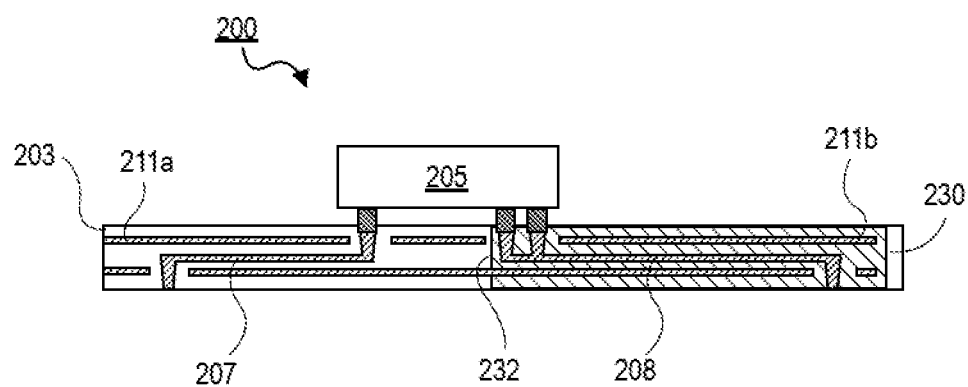

Referring now to FIGS. 2A-2B, a top-view illustration and a respective cross-sectional illustration of a semiconductor package 200 is shown, in accordance with an embodiment. The semiconductor package 200 may be substantially similar to the semiconductor package 100 described above in FIG. 1, with the exception that the magnetic region 232 may be disposed and positioned only in a specified region of the package substrate 203 (e.g., in the specified region of the differential I/O routing interface 208 of the package substrate 203). Whereas the magnetic layers 132a-b may be disposed in each of the build-up layers of the package substrate 103 in FIG. 1 (including the single-ended I/O routing interface), the magnetic region 232 may be disposed only within (or around) the differential I/O routing interface 208 of the package substrate 203 in FIGS. 2A-2B (excluding the single-ended I/O routing interface 207 that may be comprised of a dielectric material instead of a magnetic material). Likewise, the package substrate 203 with the differential routing traces 211b and the magnetic region 232 may be substantially similar to the package substrate 103 with the second conductive layer 111 and the magnetic layers 132a-b described above in FIG. 1.

In an embodiment, the semiconductor package 200 may include a package substrate 203. In an embodiment, the package substrate 203 may include a single-ended I/O routing interface 207 and a differential I/O routing interface 208. The package substrate 203 may have a routing layer that includes the single-ended and differential I/O interfaces 207-208. For one embodiment, the single-ended I/O interface 207 includes a plurality of single-ended routing traces 211a, while the differential I/O interface 208 includes a plurality of differential routing traces 211b.

In an embodiment, as shown in FIG. 2A, the package substrate 203 also includes a dielectric layer 230 and a magnetic region 232. In these embodiments, the magnetic region 232 may only embed/surround the differential routing traces 211b, while the dielectric layer 230 may embed/surround the single-ended routing traces 211a and the magnetic region 232, and the dielectric layer 230 may also be disposed within most of the build-up layers of the package substrate 203 except the magnetic region 232. For example, the package substrate 203 may have the single-ended routing traces 211a surrounded by the dielectric layer 230, while the differential routing traces 211b (or the differential routing traces 211b located near the die 205) are mainly surrounded by the magnetic region 232, thereby enabling magnetic materials to be disposed in specific signal routing regions to improve I/O performance of the semiconductor package 200 such as the substantially reduced insertion loss of the semiconductor package 200. Note that the magnetic materials of the magnetic region 232 may fully surround (or embed) the differential routing traces 211b below and above the differential routing traces 211b at the designated respective regions as shown in FIGS. 2A-2B (i.e., the differential routing traces 211b positioned (or located) in the magnetic region 232 may be completely embedded/surrounded with the magnetic materials of the magnetic region 232).

According to some embodiments, the package substrate 203 may include alternating layers of build-up layers, such as dielectric layers, magnetic layers/regions, etc., and conductive routing layers (e.g., the conductive (or metallic/copper) routing traces 211a-b) as is known in the art. The package substrate 203 may include, but is not limited to, a substrate, a printed circuit board (PCB), and a motherboard. For one embodiment, the package substrate 203 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers 230 and one or more magnetic regions 232, where each dielectric layer can be a photosensitive dielectric layer. For some embodiments, holes may be drilled in the PCB 203. For one embodiment, the PCB 203 may also include conductive routing layers with traces 211a-b (e.g., copper traces, pads, lines, planes, etc.), vias, interconnects, holes, and/or the like.

Additionally, as shown in FIGS. 2A-2B, the die 205 may be disposed on the package substrate 203. In one embodiment, the die 205 may include a microelectronic device, a semiconductor die, an integrated circuit (IC), a central processing unit (CPU), a microprocessor, a platform controller hub (PCH), a memory, and/or a field-programmable gate array (FPGA). As described above, the die 205 may include both single-ended and differential I/O interfaces 207-208 for routing the single-ended and differential traces 211a-b (e.g., conductive (or copper) traces), respectively.

In some embodiments, the dielectric layer 230 may include any dielectric material(s) as is/are known in the art. As described above, the dielectric layer 230 may be disposed within the package substrate 203, where the package substrate 203 is fully comprised of the dielectric layer 230 with the magnetic region 232 being the exception. That is, in some embodiments, the dielectric layer 230 may surround the magnetic region 232 and may be disposed (or encompasses) the remaining regions of the package substrate 203. Additionally, in these embodiments, the die 205 is on the package substrate 203, where the die 205 has a first edge with the single-ended I/O routing region 207, and a second edge with the differential I/O routing region 208, and where the single-ended I/O routing region 207 of the first edge is opposite to the differential I/O routing region 208 of the second edge. Furthermore, as shown in FIGS. 2A-2B, the dielectric layer 230 includes (and surrounds) the single-ended I/O routing region 207 and traces 211a, while the magnetic region 232 includes (and surrounds) the differential I/O routing region 208 and traces 211b.

As described above, the magnetic region 232 may be tailored for any desired/specific application by reformulating (or optimizing) one or more magnetic material compositions. The magnetic region 232 may be substantially similar to the magnetic layers 132a-b. In an embodiment, the magnetic materials of the magnetic region 232 may include ferrite (or ferroelectric) materials, conductive materials (or powders), epoxy materials, combinations thereof, and/or any similar magnetic materials. In some embodiments, the magnetic region 232 may be optimized with magnetic materials such as Mn ferrite, Zn/Mn ferrite, Ni/Zn ferrite, and/or the like. In some embodiments, the ferrite materials of the magnetic region 232 may include, but are not limited to, HfZrO/HZO, Si-doped hafnium oxide, Ge-doped hafnium oxide, Al-doped hafnium oxide, Y-doped hafnium oxide, and/or the like.

Additionally, in some embodiments, the magnetic region 232 may be implemented with one or more parameters to improve the insertion loss of the differential routing traces 211b. For example, the specified parameters of the magnetic region 232 may include a base filler chemistry, a filler shape, a filler percentage, a permeability, a loss, a frequency, and so on. For example, the magnetic region 232 may include a base filler chemistry of Mn ferrite, Zn/Mn ferrite, Ni/Zn ferrite, and/or the like. In an embodiment, when the base filler chemistry of the magnetic layers 132a-b is a Mn ferrite, the filler shape may be a spherical type (e.g., with a size of approximately 2 um or smaller), the filler percentage may be between approximately 5 to 95%. For another embodiment, when the base filler chemistry of the magnetic region 232 is a Zn/Mn ferrite, the filler shape may be a crushed type (e.g., with a size of approximately 10 um or less), the filler percentage may be between approximately 5 to 95%.

Moreover, in some embodiments, the magnetic region 232 may implement low constant $\mu_r$ values (e.g., $\mu_r$ values of approximately 2 or less) and a substantially low (or nearly) zero magnetic tan δ at high frequencies (e.g., tan δ values of approximately 10 GHz or greater). Additionally, the magnetic region 232 may be tailored by implementing one or more tuning options to achieve $\mu_r$ of approximately equal to 2 and magnetic tan δ of approximately 0.03 or less at high frequencies, where such tuning options may include: (i) modifying the filler composition, shape, orientation, and loading fractions to achieve the desired magnetic properties, for example by focusing on the Mn ferrite filler-based materials as compared to Mn/Zn ferrite filler-based materials, and by also optimizing the resin formulations to improve the packing fractions; (ii) optimizing the filler treatment methods and manufacturing processes such as the surface coating/heat treatment improvements; and, (iii) when optimizing the magnetic properties, by optimizing the process compatibility with the organic substrate manufacturing process flow, especially the chemical resistance with wet chemistries. Note that, in some embodiments, the magnetic tan δ value is not negligible, and the insertion loss increases with the magnetic tan δ. Hence, in these embodiments, it is also important to note/control the magnetic tan δ to be approximately less than 0.03 and up to 10 GHz in frequency to ensure the desired insertion loss of the differential routing traces 211.

For some embodiments, the package substrate 203 may implement the magnetic region 232 as the entire (or complete) stack of build-up layers within the specified region of the differential I/O routing interface 208, and the magnetic region 232 to extend from the bottommost conductive layer to the topmost conductive layer as shown in FIG. 2B. In these embodiments, the package substrate 203 may have substantially all of the build-up layers comprised of the dielectric layer 230, while the magnetic region 232 may comprise only a smaller/specified region of the package substrate 203. Note that, in some embodiments, as shown in FIG. 2A, the magnetic region 232 may have a cylindrical (or square) shape that may have substantially vertical sidewalls surrounded by the dielectric layer 230. However, in other embodiments, the magnetic region 232 may have any desired shape, may be disposed (or positioned/located) within any desired region of the package substrate 203, and may have substantially vertical sidewalls, tapered sidewalls, and so on.

Also, as described above, in an alternative embodiment, the magnetic material of the magnetic region 232 may be applied to the standard organic substrate of the package substrate 203. For example, the single-ended traces (or striplines) may be designed for approximately 50 ohm target impedance in a typical organic package substrate. As such, the insertion loss of the single-ended traces 211a of the package substrate 203 at 16 GHz is 1.28 dB/cm. Similar to high-density packages, if the low-loss dielectric is also includes the magnetic materials (assuming $\mu_r$ is only 2), the trace width may need to increase to 37 um from 16 um for the same 50 ohm impedance target. As such, the insertion loss may be reduced to 1.08 dB/cm from the previous 1.28 dB/cm at 16 GHz, a 16% improvement.

Note that the semiconductor package 200 of FIGS. 2A-2B may include fewer or additional packaging components based on the desired packaging design.

Figure 3A:
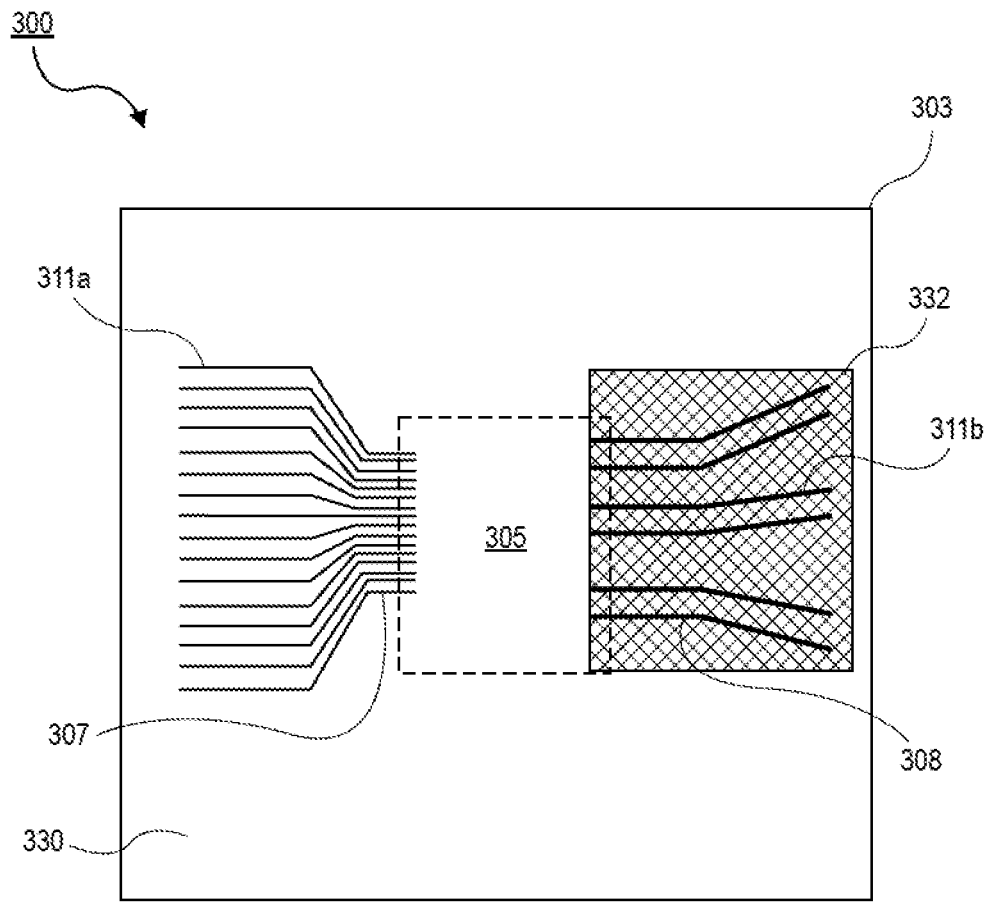
FIGS. 3A-3B are illustrations of a plan view and a respective cross-sectional view of a semiconductor package with a die and a package substrate, where the package substrate includes a plurality of single-ended I/O traces, a plurality of differential I/O traces, and a magnetic region, according to some embodiments.
Figure 3B:
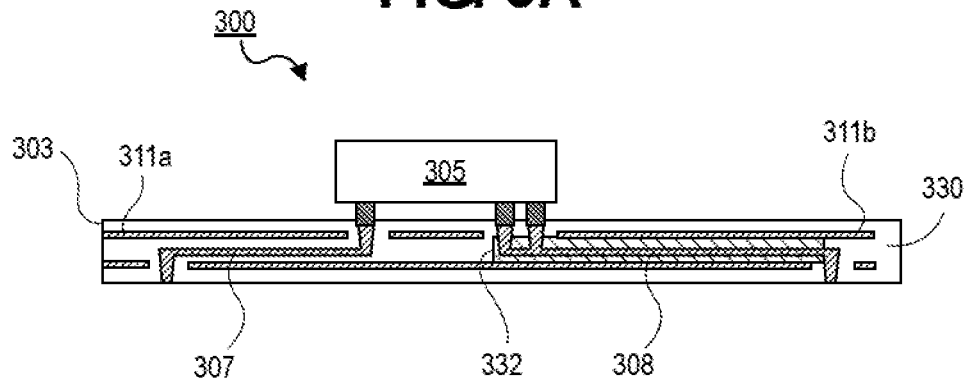

Referring now to FIGS. 3A-3B, a top-view illustration and a respective cross-sectional illustration of a semiconductor package 300 is shown, in accordance with an embodiment. The semiconductor package 300 may be substantially similar to the semiconductor packages 100 and 200 described above in FIGS. 1 and 2A-2B, with the exception that the magnetic region 332 may be disposed and positioned only in a specified region of the package substrate 303 (e.g., as shown with FIG. 3A in the specified region of the differential I/O routing interface 308 of the package substrate 303), and a specified/selected layer (or a sub-layer) of the package substrate 303 (e.g., as shown with FIG. 3B in the specified/selected layer of the differential I/O routing interface 308 of the package substrate 303). Likewise, the die 305 and the package substrate 303 with the single-ended and differential I/O routing interfaces 307-308, the single-ended and differential routing traces 311a-b, the dielectric layer 330, and the magnetic region 332 may be substantially similar to the die 205 and the package substrate 203 with the single-ended and differential I/O routing interfaces 207-208, the single-ended and differential routing traces 211a-b, the dielectric layer 230, and the magnetic region 232 described above in FIGS. 2A-2B.

Also, whereas the magnetic region 232 may be disposed in each of the build-up layers within the specified region of the differential I/O routing interface 208 of the package substrate 203 in FIGS. 2A-2B, the magnetic region 332 may be disposed only within one (or a specified/selected/limited number) layer of the build-up layers within the differential I/O routing interface 308 of the package substrate 303 in FIGS. 3A-3B. That is, the magnetic region 232 in FIGS. 2A-2B may be disposed within the differential I/O routing interface 208 and extend from the bottommost conductive layer to the topmost conductive layer of the package substrate 203. Whereas, the magnetic region 332 in FIGS. 3A-3B may be disposed within the differential I/O routing interface 308 and does not extend from the bottommost conductive layer to the topmost conductive layer of the package substrate 303, rather the magnetic region 332 may be positioned within a specified (or selected) layer(s) of the package substrate 303. For example, as shown in FIG. 3b, the magnetic layer 332 may be disposed over/on/around one or more of the differential routing traces 311b, where the magnetic layer 332 may be positioned between the top and bottom surfaces of the package substrate 303. As such, in these embodiments, the dielectric layer 330 may fully surround the magnetic region 332, which includes disposing the dielectric layer 330 above and below the top and bottom surfaces of the magnetic region 332.

Note that the semiconductor package 300 of FIGS. 3A-3B may include fewer or additional packaging components based on the desired packaging design.

Figure 4A:
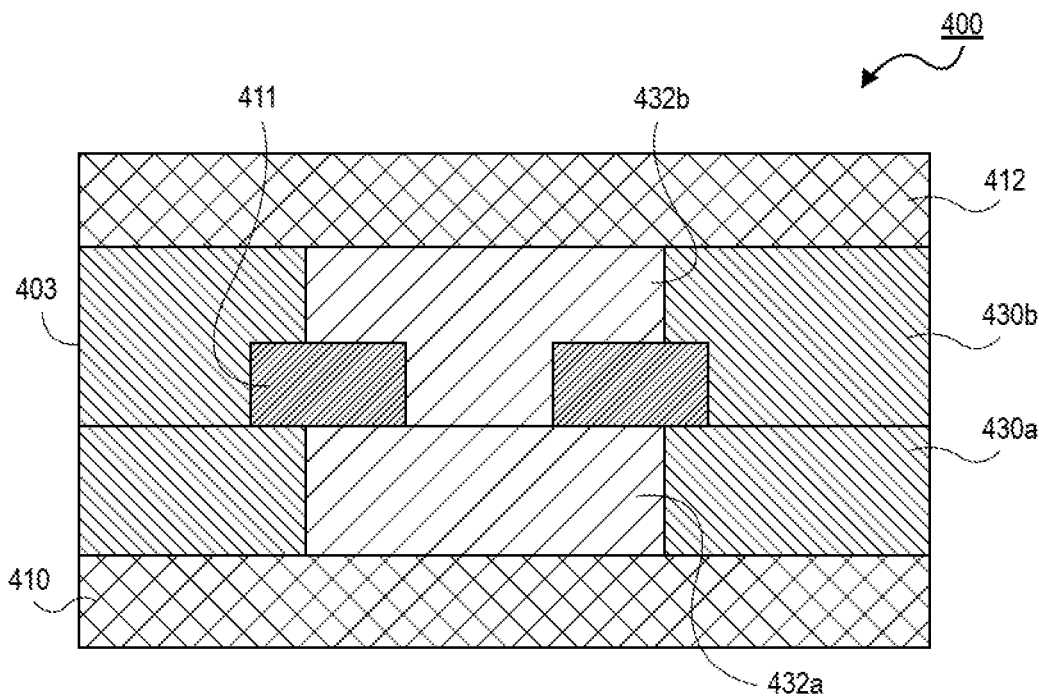
FIG. 4A is an illustration of a cross-sectional view of a package substrate that includes a plurality of conductive layers, a plurality of differential traces, a plurality of dielectric regions, and a plurality of magnetic regions, according to one embodiment.

Referring now to FIG. 4A, a cross-sectional illustration of a semiconductor package 400 is shown, in accordance with an embodiment. The semiconductor package 400 may be substantially similar to the semiconductor package 100 described above in FIG. 1 (and/or any of the semiconductor packages described above in FIGS. 2A-2B and 3A-3B), with the exception that the magnetic regions 432a-b may be disposed and positioned only in a specified region of the package substrate 403, and may only surround portions of the traces 411. As such, in some embodiments, the package substrate 403 with the traces 411, the conductive layers 410 and 412, and the magnetic regions 432a-b may be substantially similar to the package substrate 103 with the second conductive layers (traces) 111, the conductive layers 110 and 112, and the magnetic layers 132a-b described above in FIG. 1, according to one embodiment. Also, in these embodiments, the dielectric layers 430a-b (or dielectric regions) may be substantially similar to the dielectric layers 230 and 330 described above in FIGS. 2A-2B and 3A-3B.

Also, whereas the magnetic layers 132a-b may be disposed in each layer of the build-up layers of the package substrate 103 and may fully surround the second conductive layers (traces) 111 in FIG. 1, the magnetic regions 432a-b may be disposed in only a specified region(s) of the build-up layers of the package substrate 403 and may only surround portions of the traces 411 in FIG. 4A. For example, as shown in FIG. 4A, the magnetic regions 432a-b may be disposed between the traces 411 and may only surround portions of the traces 411, where the dielectric layers 430a-b may thus surround the remaining portions of the traces 411 and the magnetic regions 432a-b. Note that, in other embodiments, the magnetic regions 432a-b may fully surround and embed the traces 411 without having the dielectric layers 430a-b surrounding any portions of the traces 411. In such other embodiments, the dielectric layers 430a-b may be disposed around (and/or adjacent to) the magnetic regions 432a-b without covering any surfaces of the traces 411. That is, in some embodiments, the magnetic regions 432a-b may have a width that is less than a width defined from the outer, left sidewall of the first trace 411 (or the left trace as shown in FIG. 4A) to the other outer, right sidewall of the second trace 411 (or the right trace as shown in FIG. 4A). While, in alternative embodiments, the magnetic regions 432a-b may have a width that is equal to or greater than a width defined from the outer, left sidewall of the first trace 411 to the other outer, right sidewall of the second trace 411.

Figure 4B:
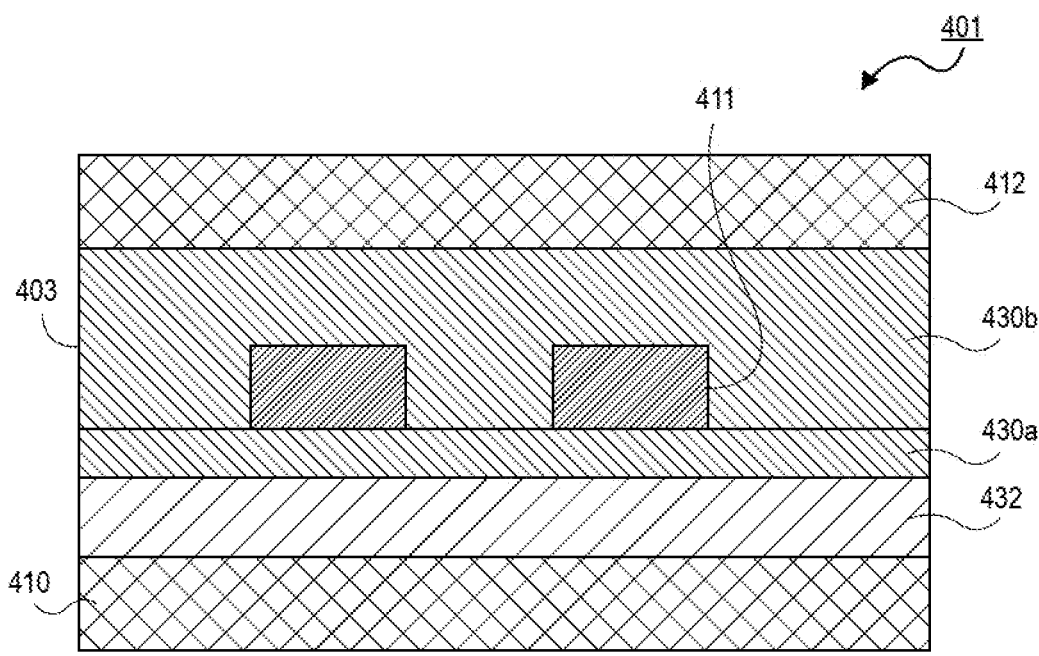
FIG. 4B is an illustration of a cross-sectional view of a package substrate that includes a plurality of conductive layers, a plurality of differential traces, a dielectric layer, and a magnetic layer, according to one embodiment.

Referring now to FIG. 4B, a cross-sectional illustration of a semiconductor package 401 is shown, in accordance with an embodiment. The semiconductor package 401 may be substantially similar to the semiconductor package 400 described above in FIG. 4A, with the exception that the magnetic layer 432 may be disposed only within a specified layer(s) of the package substrate 403. As such, in some embodiments, the package substrate 403 with the traces 411, the conductive layers 410 and 412, the dielectric layers 430a-b, and the magnetic layer 432 may be substantially similar to the package substrate 403 with the traces 411, the conductive layers 410 and 412, the dielectric layers 430a-b, and the magnetic regions 432a-b described above in FIG. 4A, according to one embodiment.

Also, whereas the magnetic regions 432a-b may be disposed in each layer of the build-up layers of the package substrate 403 and may fully/partially surround the traces 411 in FIG. 4A, the magnetic layer 432 in FIG. 4B may be disposed in only a specified region(s) and/or a specified/selected layer of the build-up layers of the package substrate 403, where the magnetic layer 432 may not be disposed directly on any portions (or surfaces) of the traces 411. For example, as shown in FIG. 4B, the magnetic layer 432 may not surround the traces 411, instead the magnetic layer 432 may be disposed below (or above, over, around, adjacent to, etc.) the traces 411. In these embodiments, the magnetic layer 432 may be disposed in a selected region and/or a selected layer of the build-up layers of the package substrate 403. As such, in some embodiments, the magnetic layer 432 may be disposed as an entire selected layer of the package substrate 403 that is disposed below/above the traces 411 (i.e., the magnetic layer 432 may have a footprint that is substantially equal to a footprint of the package substrate 403). Alternatively, in other embodiments, the magnetic layer 432 may be disposed as a selected layer of a selected region of the package substrate 403 that is disposed below/above the traces 411 (i.e., the magnetic layer 432 may have a footprint that is less than a footprint of the package substrate 403).

Additionally, as shown in FIG. 4B, the magnetic layer 432 may be disposed below the traces 411, where the dielectric layers 430a-b may fully surround the traces 411 above and below, and may be disposed directly over/on the magnetic layer 432 (i.e., the dielectric layers 430a-b may stacked directly over/on the top surface of the magnetic layer 432). In another embodiment, the magnetic layer 432 may be disposed over and positioned above the traces 411, instead of being disposed under and positioned below the traces 411 as shown in FIG. 4B. Additionally, one magnetic layer 432 may be illustrated in FIG. 4B, however it is important to note that two or more magnetic layers 432 may be implemented if desired (e.g., a second (or an additional) magnetic layer may be disposed above the traces 411 and the magnetic layer 432).

Note that the semiconductor packages 400-401 of FIGS. 4A-4B may include fewer or additional packaging components based on the desired packaging design.

Figure 5:
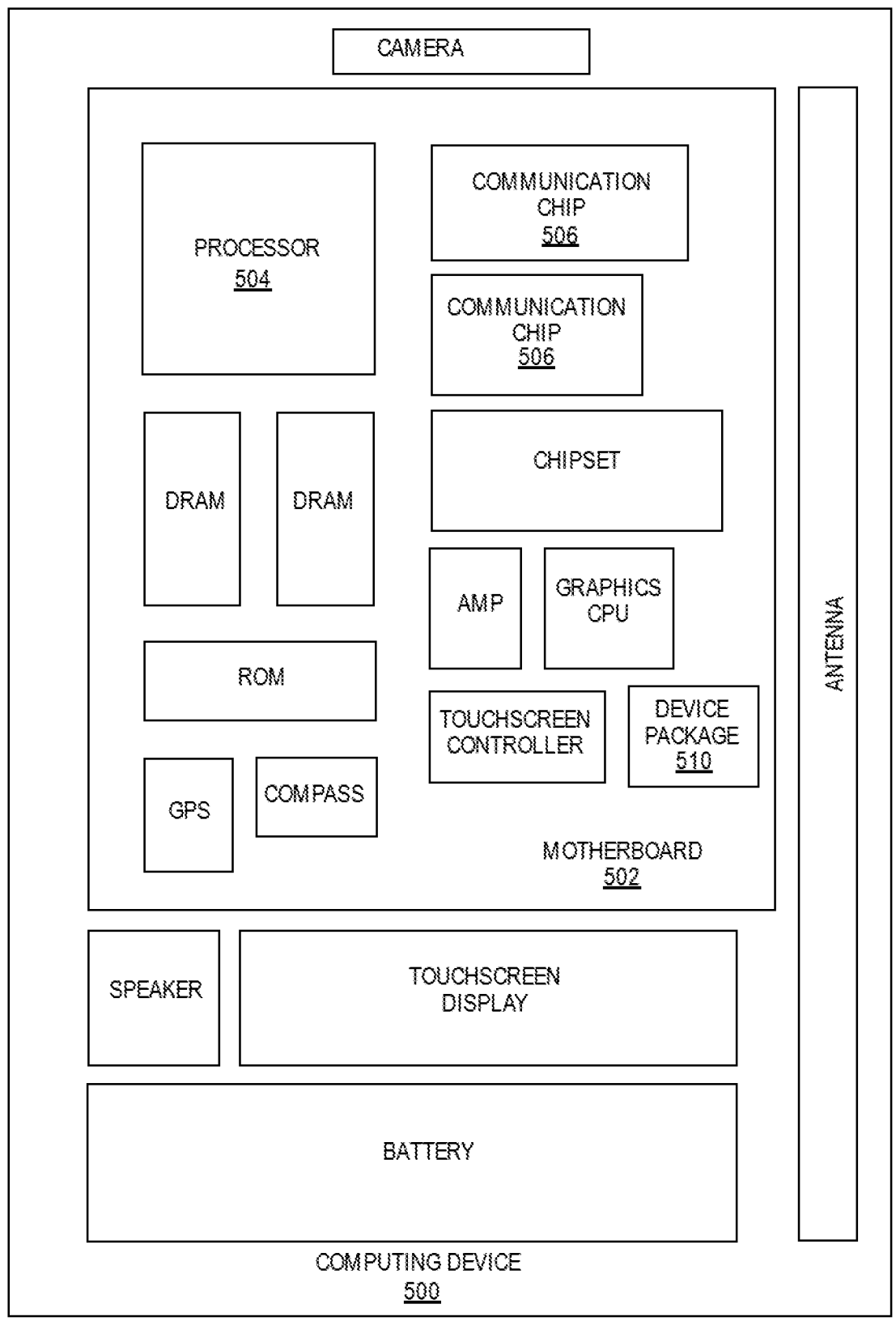
FIG. 5 is an illustration of a schematic block diagram illustrating a computer system that utilizes a semiconductor package with a package substrate that includes a plurality of conductive layers, a plurality of differential traces, a plurality of dielectric regions, and a plurality of magnetic regions, according to one embodiment.

FIG. 5 is an illustration of a schematic block diagram illustrating a computer system 500 that utilizes a device package 510 (or a semiconductor package) with a package substrate includes a plurality of conductive layers, a plurality of signal/routing traces, a plurality of magnetic layers/regions, and/or a plurality of dielectric layers, according to one embodiment. FIG. 5 illustrates an example of computing device 500.

Computing device 500 houses motherboard 502. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may include, but is not limited to, a substrate, a package substrate, and/or a PCB. In one embodiment, device package 510 may be a semiconductor package as described herein. Device package 510 may include a package substrate with the routing traces that may be fully/partially surrounded by the magnetic layers/regions as described herein (e.g., as illustrated in FIGS. 1, 2A-2B, 3A-3B, and 4A-4B)—or any other components from the figures described herein.

Note that device package 510 may be a single component/device, a subset of components, and/or an entire system, as the materials, features, and components may be limited to device package 510 and/or any other component of the computing device 500 that may need the magnetic layers/regions surrounding the single-ended and/or differential traces within each (or a selected number of) layer of the build-up layers of the package substrate as described herein (e.g., the motherboard 502, the processor 504, and/or any other component of the computing device 500 may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip 506 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a first conductive layer in a first magnetic layer; a second magnetic layer over the first magnetic layer, wherein the first and second magnetic layers include a plurality of magnetic materials; a second conductive layer in the second magnetic layer, wherein the second conductive layer includes a plurality of first traces, and wherein the plurality of first traces are fully surrounded by the first and second magnetic layers; and a third conductive layer over the second magnetic layer, wherein the plurality of magnetic materials include Mn ferrite materials, Zn/Mn ferrite materials, Ni/Zn ferrite materials, any similar ferrite materials, and/or any combination thereof.

In example 2, the subject matter of example 1 can optionally include that the second conductive layer further includes a plurality of second traces.

In example 3, the subject matter of examples 1-2 can optionally include that the plurality of second traces are fully surrounded by the first and second magnetic layers.

In example 4, the subject matter of examples 1-3 can optionally include a plurality of build-up layers that extend from a bottommost surface to a topmost surface.

In example 5, the subject matter of examples 1-4 can optionally include that each of the plurality of build-up layers includes the plurality of magnetic materials.

In example 6, the subject matter of examples 1-5 can optionally include that the plurality of first traces are a plurality of single-ended routing traces, and wherein the plurality of second traces are a plurality of differential routing traces.

In example 7, the subject matter of examples 1-6 can optionally include that the plurality of single-ended routing traces have a width and a line spacing that is lower than a width and a line spacing of the plurality of differential routing traces, wherein the plurality of single-ended routing traces and the plurality of differential routing traces are fully surrounded by the plurality of magnetic materials.

In example 8, the subject matter of examples 6 can optionally include that the plurality of magnetic materials include a plurality of material properties, and wherein the plurality of material properties include a low constant value, a magnetic tangent value, a frequency, a base filler chemistry, a filler shape, a filler orientation, a filler percentage, a loading fraction value, a permeability, an insertion loss, and a resin formulation.

In example 9, the subject matter of examples 1-8 can optionally include the low constant value is approximately 2, wherein the base filler chemistry includes Mn ferrite, Zn/Mn ferrite, Ni/Zn ferrite, any similar ferrite, and/or any combination thereof, wherein the filler percentage of the base filler chemistry is approximately 5% to 95%, wherein the magnetic tangent value is approximately 0.00 to 0.03, wherein the frequency is approximately 10 MHz to 50 MHz, wherein the filler shape includes a spherical type, a crushed type, or any specific/desired shape for magnetic property purposes, and wherein the permeability is approximately 5 to 20.

Example 10 is a package substrate, comprising: a first conductive layer in a first dielectric layer; a second dielectric layer over the first dielectric layer; a second conductive layer in the second dielectric layer, wherein the second conductive layer includes a plurality of first traces; a third conductive layer over the second dielectric layer; and a plurality of magnetic regions in between the first and third conductive layers, wherein plurality of magnetic regions include a first magnetic region, a second magnetic region, or a third magnetic region, wherein the plurality of magnetic regions include a plurality of magnetic materials, and wherein the plurality of magnetic materials include Mn ferrite materials, Zn/Mn ferrite materials, Ni/Zn ferrite materials, any similar ferrite materials, and/or any combination thereof.

In example 11, the subject matter of example 10 can optionally include the first magnetic region vertically extends from the first conductive layer to the third conductive layer, wherein the first magnetic region fully surrounds the first traces, and wherein the first and second dielectric layers vertically surround the first magnetic region.

In example 12, the subject matter of examples 10-11 can optionally include that the second magnetic region is in the first dielectric layer or the second dielectric layer, wherein the second magnetic region is positioned above the first traces, below the first traces, or through the first traces, wherein, when the second magnetic region is positioned above or below the first traces, the first traces are fully surrounded by the first dielectric layer or the second dielectric layer, wherein, when the second magnetic region is positioned through the first traces, the second magnetic region has a thickness that is approximately equal to a thickness of the first traces, and wherein, when the second magnetic region is positioned through the first traces, the second magnetic region fully surrounds or partially surrounds the first traces.

In example 13, the subject matter of examples 10-12 can optionally include that the third magnetic region vertically extends from the first conductive layer to the third conductive layer, wherein the third magnetic region fully surrounds or partially surrounds the first traces, wherein the third magnetic region is positioned between the first traces, wherein the third magnetic region has a width that is approximately equal to or less than a total width of the first traces, wherein the total width of the first traces is defined by a combined width of the first traces and a width between the first traces, wherein the first and second dielectric layers vertically surround the third magnetic region, and wherein, when the third magnetic region partially surrounds the first traces, the first and second dielectric layers also partially surround the first traces.

In example 14, the subject matter of examples 10-13 can optionally include that the second conductive layer further includes a plurality of second traces.

In example 15, the subject matter of examples 10-14 can optionally include that the plurality of second traces are fully surrounded by the first and second dielectric layers.

In example 16, the subject matter of examples 10-15 can optionally include a plurality of build-up layers that extend from a bottommost surface to a topmost surface, and wherein the plurality of build-up layers include the plurality of magnetic regions.

In example 17, the subject matter of examples 10-16 can optionally include that the plurality of first traces are a plurality of single-ended routing traces, wherein the plurality of second traces are a plurality of differential routing traces, wherein the plurality of single-ended routing traces have a width and a line spacing that is lower than a width and a line spacing of the plurality of differential routing traces, wherein the plurality of single-ended routing traces are fully surrounded by the first and second dielectric layers, and wherein the plurality of differential routing traces are fully surrounded or partially surrounded by the plurality of magnetic regions.

In example 18, the subject matter of example 10-17 can optionally include that the plurality of magnetic materials include a plurality of material properties, wherein the plurality of material properties include a low constant value, a magnetic tangent value, a frequency, a base filler chemistry, a filler shape, a filler orientation, a filler percentage, a loading fraction value, a permeability, an insertion loss, and a resin formulation, wherein the low constant value is approximately 2, wherein the base filler chemistry includes Mn ferrite, Zn/Mn ferrite, Ni/Zn ferrite, any similar ferrite, and/or any combination thereof, wherein the filler percentage of the base filler chemistry is approximately 5% to 95%, wherein the magnetic tangent value is approximately 0.00 to 0.03, wherein the frequency is approximately 10 MHz to 50 MHz, wherein the filler shape includes a spherical type, a crushed type, or any specific/desired shape for magnetic property purposes, and wherein the permeability is approximately 5 to 20.

Example 19 is a semiconductor package, comprising: a package substrate; a dielectric region and a magnetic region in the package substrate, wherein the magnetic region includes a plurality of magnetic materials, and wherein the plurality of magnetic materials include Mn ferrite materials, Zn/Mn ferrite materials, Ni/Zn ferrite materials, any similar ferrite materials, and/or any combination thereof; and a die on the package substrate, wherein the die has a first edge with a first I/O routing region, and a second edge with a second I/O routing region, wherein the first I/O routing region of the first edge is opposite to the second I/O routing region of the second edge, wherein the dielectric region includes the first I/O routing region, and the magnetic region includes the second I/O routing region, wherein the dielectric region vertically surrounds the magnetic region, and wherein the dielectric region of the package substrate has an area that is greater than an area of the magnetic region of the package substrate.

In example 20, the subject matter of example 19 can optionally include that the package substrate further includes a first conductive layer in a first magnetic layer of the magnetic region; a second magnetic layer of the magnetic region over the first magnetic layer of the magnetic region, wherein the first and second magnetic layers include the plurality of magnetic materials; a second conductive layer in the second magnetic layer, wherein the second conductive layer includes a plurality of first traces and a plurality of second traces, wherein the plurality of first traces are positioned in the second I/O routing region, wherein the plurality of second traces are positioned in the first I/O routing region, and wherein the plurality of first traces are fully surrounded by the first and second magnetic layers of the magnetic region; and a third conductive layer over the second magnetic layer.

In example 21, the subject matter of examples 19-20 can optionally include the plurality of second traces are fully surrounded by the dielectric region.

In example 22, the subject matter of example 19-21 can optionally include that the package substrate includes a plurality of build-up layers that extend from a bottommost surface of the package substrate to a topmost surface of the package substrate.

In example 23, the subject matter of examples 19-22 can optionally include that each of the plurality of build-up layers includes the dielectric region and the magnetic region.

In example 24, the subject matter of examples 19-23 can optionally include that the plurality of first traces are a plurality of differential routing traces, wherein the plurality of second traces are a plurality of single-ended routing traces, wherein the plurality of single-ended routing traces have a width and a line spacing that is lower than a width and a line spacing of the plurality of differential routing traces, wherein the plurality of single-ended routing traces are fully surrounded by the dielectric region, and wherein the plurality of differential routing traces are fully surrounded by the magnetic region.

In example 25, the subject matter of examples 19-24 can optionally include that the plurality of magnetic materials include a plurality of material properties, wherein the plurality of material properties include a low constant value, a magnetic tangent value, a frequency, a base filler chemistry, a filler shape, a filler orientation, a filler percentage, a loading fraction value, a permeability, an insertion loss, and a resin formulation, and wherein the low constant value is approximately 2, wherein the base filler chemistry includes Mn ferrite, Zn/Mn ferrite, Ni/Zn ferrite, any similar ferrite, and/or any combination thereof, wherein the filler percentage of the base filler chemistry is approximately 5% to 95%, wherein the magnetic tangent value is approximately 0.00 to 0.03, wherein the frequency is approximately 10 MHz to 50 MHz, wherein the filler shape includes a spherical type, a crushed type, or any specific/desired shape for magnetic property purposes, and wherein the permeability is approximately 5 to 20.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A package substrate, comprising:
a first conductive layer in a first magnetic layer;
a second magnetic layer over the first magnetic layer, wherein the first and second magnetic layers include a plurality of magnetic materials;

a second conductive layer in the second magnetic layer, wherein the second conductive layer includes a plurality of first traces, and wherein the plurality of first traces are fully surrounded by the first and second magnetic layers, wherein the second conductive layer further includes a plurality of second traces, wherein the plurality of first traces are a plurality of single-ended routing traces, wherein the plurality of second traces are a plurality of differential routing traces, wherein the plurality of single-ended routing traces have a width and a line spacing that is lower than a width and a line spacing of the plurality of differential routing traces, and wherein the plurality of single-ended routing traces and the plurality of differential routing traces are fully surrounded by the plurality of magnetic materials; and a third conductive layer over the second magnetic layer, wherein the plurality of magnetic materials include manganese (Mn) ferrite materials, zinc (Zn) and Mn (Zn/Mn) ferrite materials, or nickel (Ni) and Zn (Ni/Zn) ferrite materials.

2. The package substrate of claim 1, wherein the plurality of second traces are fully surrounded by the first and second magnetic layers.

3. The package substrate of claim 1, further comprising a plurality of build-up layers that extend from a bottommost surface to a topmost surface.

4. The package substrate of claim 3, wherein each of the plurality of build-up layers includes the plurality of magnetic materials.

5. The package substrate of claim 1, wherein the plurality of magnetic materials include a plurality of material properties, and wherein the plurality of material properties include a low constant value, a magnetic tangent value, a frequency, a base filler chemistry, a filler shape, a filler orientation, a filler percentage, a loading fraction value, a permeability, an insertion loss, and a resin formulation.

6. The package substrate of claim 5, wherein the low constant value is approximately 2, wherein the base filler chemistry includes Mn ferrite, Zn/Mn ferrite, or Ni/Zn ferrite, wherein the filler percentage of the base filler chemistry is approximately 5% to 95%, wherein the magnetic tangent value is approximately 0.00 to 0.03, wherein the frequency is approximately 10 MHz to 50 MHz, wherein the filler shape includes a spherical type, a crushed type, or one or more types of specified shapes, and wherein the permeability is approximately 5 to 20.

7. A package substrate, comprising:
a first conductive layer in a first magnetic layer;
a second magnetic layer over the first magnetic layer, wherein the first and second magnetic layers include a plurality of magnetic materials;
a second conductive layer in the second magnetic layer, wherein the second conductive layer includes a plurality of first traces, and wherein the plurality of first traces are fully surrounded by the first and second magnetic layers; and
a third conductive layer over the second magnetic layer, wherein the plurality of magnetic materials include manganese (Mn) ferrite materials, zinc (Zn) and Mn (Zn/Mn) ferrite materials, or nickel (Ni) and Zn (Ni/Zn) ferrite materials, wherein the plurality of magnetic materials include a plurality of material properties, and wherein the plurality of material properties include a low constant value, a magnetic tangent value, a frequency, a base filler chemistry, a filler shape, a filler orientation, a filler percentage, a loading fraction value, a permeability, an insertion loss, and a resin formulation, wherein the low constant value is approximately 2, wherein the base filler chemistry includes Mn ferrite, Zn/Mn ferrite, or Ni/Zn ferrite, wherein the filler percentage of the base filler chemistry is approximately 5% to 95%, wherein the magnetic tangent value is approximately 0.00 to 0.03, wherein the frequency is approximately 10 MHz to 50 MHz, wherein the filler shape includes a spherical type, a crushed type, or one or more types of specified shapes, and wherein the permeability is approximately 5 to 20.

8. The package substrate of claim 7, wherein the second conductive layer further includes a plurality of second traces.

9. The package substrate of claim 8, wherein the plurality of second traces are fully surrounded by the first and second magnetic layers.

10. The package substrate of claim 7, further comprising a plurality of build-up layers that extend from a bottommost surface to a topmost surface.

11. The package substrate of claim 10, wherein each of the plurality of build-up layers includes the plurality of magnetic materials.

12. The package substrate of claim 8, wherein the plurality of first traces are a plurality of single-ended routing traces, and wherein the plurality of second traces are a plurality of differential routing traces.

* * * * *